US006188284B1

(12) United States Patent
Shulman

(10) Patent No.: US 6,188,284 B1
(45) Date of Patent: Feb. 13, 2001

(54) DISTRIBUTED GAIN LINE DRIVER AMPLIFIER INCLUDING IMPROVED LINEARITY

(75) Inventor: Dima David Shulman, Marlboro, NJ (US)

(73) Assignee: Lucent Technologies Inc., Murray Hill, NJ (US)

(*) Notice: Under 35 U.S.C. 154(b), the term of this patent shall be extended for 0 days.

(21) Appl. No.: 09/299,142

(22) Filed: Apr. 23, 1999

(51) Int. Cl.$^7$ .................................................. H03F 3/68
(52) U.S. Cl. ........................................ 330/295; 330/124 R
(58) Field of Search ................................ 330/51, 124 R, 330/129, 136, 295

(56) References Cited

U.S. PATENT DOCUMENTS

| 4,446,445 |   | 5/1984  | Apel .            |         |
|-----------|---|---------|-------------------|---------|
| 4,486,719 |   | 12/1984 | Ayasli .          |         |
| 4,701,716 |   | 10/1987 | Poole .           |         |
| 4,788,511 |   | 11/1988 | Schindler .       |         |
| 5,166,635 | * | 11/1992 | Shih ............. | 330/253 |
| 5,550,513 |   | 8/1996  | Wong .            |         |
| 5,606,281 | * | 2/1997  | Gloaguen ........  | 330/51  |
| 6,028,485 | * | 2/2000  | Sigmon et al. .... | 330/295 |

* cited by examiner

Primary Examiner—Benny Lee
Assistant Examiner—Henry Choe

(57) ABSTRACT

Improved linearity in a line driver amplifier is realized by employing one or more amplifier sections each including an adaptive gain amplifier connected in parallel with a distributed gain amplifier. In an embodiment of the invention, first and second amplifier sections are connected in circuit relationship to an input and an output of the line driver amplifier to form a symmetrical amplifier configuration. In a specific embodiment of the invention, the adaptive gain amplifiers in each amplifier section are class AB type amplifiers and the distributed gain amplifiers in each amplifier section are class B amplifiers. Specifically, each of the distributed gain class B amplifiers each include a plurality of output transistors and a corresponding plurality of auxiliary amplifiers. The output transistor and auxiliary amplifier pairs are connected in parallel. Each of the auxiliary amplifiers includes a built in voltage offset, beginning with an auxiliary amplifier having the smallest voltage offset to the auxiliary amplifier having the largest offset. The individual auxiliary amplifiers maintain their corresponding output transistors in an OFF state so long as the overall amplifier input signal has a magnitude less than the auxiliary amplifier offset voltage level. When the input signal magnitude level is equal to or greater than the offset level of an auxiliary amplifier, that auxiliary amplifier turns its corresponding output transistor to an ON state. Thus, for lower magnitude input signals fewer than all of the output transistors are in an ON state, while for maximum magnitude input signals all of the output transistors are in an ON state. Use of the auxiliary amplifier-output transistor pairs allows use of smaller size transistors, each of which has a lower output current than an equivalent single output transistor. Since all of the output transistors in each amplifier stage are connected in parallel, the amplifier output current is the sum of the currents passing through the ON output transistors. Moreover, the adaptive gain class AB amplifier's gain varies as a function of input signal such that for larger input signals there is more gain and, consequently, less distortion. By employing the adaptive gain amplifiers and distributed gain amplifiers the line driver amplifier open loop gain characteristic is much smoother resulting in increased linearity.

44 Claims, 6 Drawing Sheets

100

307, 311

500

503, 505

900

US 6,188,284 B1

DISTRIBUTED GAIN LINE DRIVER AMPLIFIER INCLUDING IMPROVED LINEARITY

RELATED APPLICATIONS

U.S. patent application Ser. No. 09/299,237, now U.S. Pat. No. 6,064,258 issued May 16, 2000 was filed concurrently herewith and U.S. patent application Ser. No. 09/119,431 was filed on Jul. 20, 1998.

TECHNICAL FIELD

This invention relates to amplifiers and, more particularly, to adaptive and distributed gain line driver amplifiers.

BACKGROUND OF THE INVENTION

Line driver amplifiers remain a bottleneck in modern analog circuit design. Their integration with other analog circuit components is problematic. One reason for this is that the need to employ relatively large magnitude supply voltages prevents realizing the advantages that would result from using finer and much faster integrated circuit technology. Other reasons include large power consumption, and sensitivity to noise coming from power supplies and the integrated circuit substrate. A line driver amplifier should have well-controlled quiescent currents flowing in its output transistors and have the ability to supply significantly larger currents during its transient state. The ability to supply large currents should not be compromised by non-linear open-loop gain characteristics of the line driver amplifier, because any non-linearity in the line driver characteristic translates into distortion, even though the distortion is somewhat reduced when feedback is employed.

Indeed, in known line driver amplifiers there is a significantly sharp transient in the open-loop gain input-output voltage transfer function that is extremely undesirable. Indeed, abrupt transitions in the open-loop gain transfer function result in non-linearity and must be avoided.

SUMMARY OF THE INVENTION

These and other problems and limitations of prior known line driver amplifiers are addressed by employing one or more amplifier sections each including an adaptive gain amplifier connected in parallel with a distributed gain amplifier.

In an embodiment of the invention, first and second amplifier sections are connected in circuit relationship to an input and an output of the line driver amplifier to form a symmetrical amplifier configuration.

In a specific embodiment of the invention, the adaptive gain amplifiers in each amplifier section are class AB type amplifiers and the distributed gain amplifiers in each amplifier section are class B amplifiers.

Specifically, each of the distributed gain class B amplifiers each include a plurality of output transistors and a corresponding plurality of auxiliary amplifiers. The output transistor and auxiliary amplifier pairs are connected in parallel. Each of the auxiliary amplifiers includes a built in voltage offset, beginning with an auxiliary amplifier having the smallest voltage offset to the auxiliary amplifier having the largest offset. The individual auxiliary amplifiers maintain their corresponding output transistors in an OFF state so long as the overall amplifier input signal has a magnitude less than the auxiliary amplifier offset voltage level. When the input signal magnitude level is equal to or greater than the offset level of an auxiliary amplifier, that auxiliary amplifier turns its corresponding output transistor to an ON state. Thus, for lower magnitude input signals fewer than all of the output transistors are in an ON state, while for maximum magnitude input signals all of the output transistors are in an ON state. Use of the auxiliary amplifier-output transistor pairs allows use of smaller size transistors, each of which has a lower output current than an equivalent single output transistor. Since all of the output transistors in each amplifier stage are connected in parallel, the amplifier output current is the sum of the currents passing through the ON output transistors.

Moreover, the adaptive gain class AB amplifier's gain varies as a function of input signal such that for larger input signals there is more gain and, consequently, less distortion.

By employing the adaptive gain amplifiers and distributed gain amplifiers the line driver amplifier open loop gain characteristic is much smoother resulting in increased linearity.

DETAILED DESCRIPTION

Note that in the following example, the transistors are shown as field effect transistors (FETs), however the invention may be advantageously employed with other semiconductor device transistor elements. Thus, for simplicity and clarity of exposition the FETs will hereinafter be referred to as "transistors".

Figure 1:
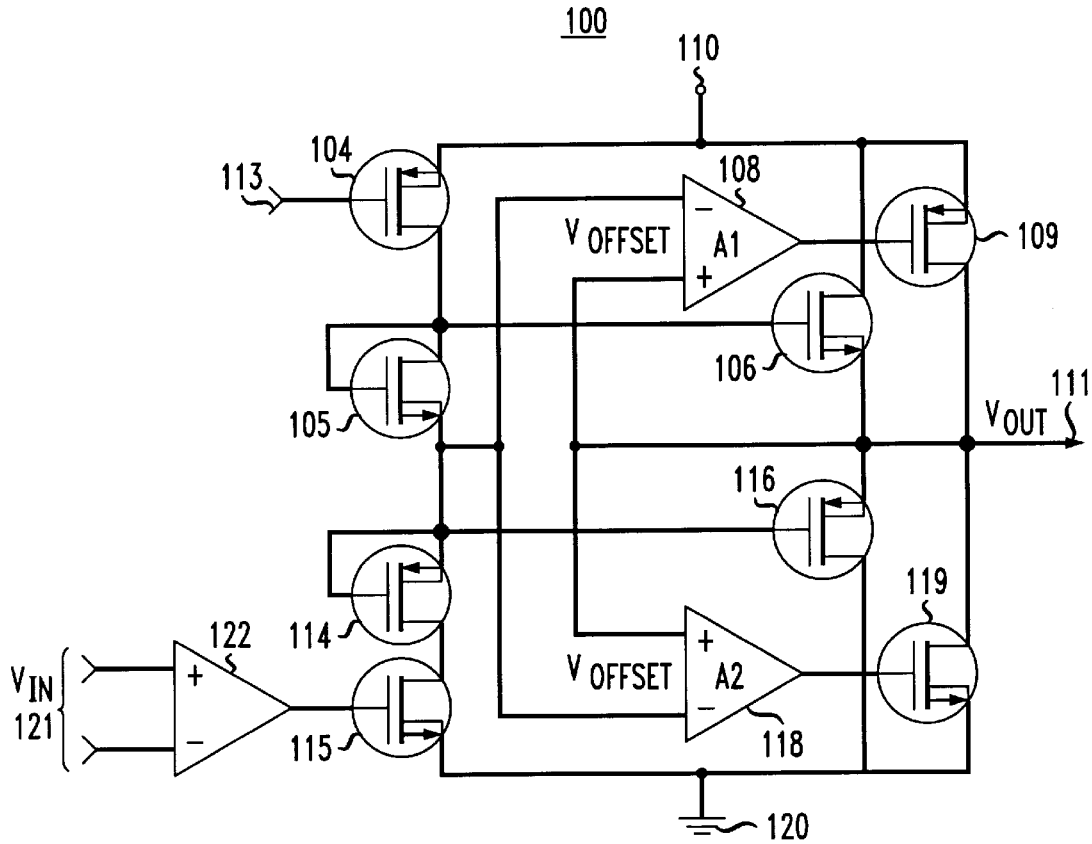
FIG. 1 shows, in simplified block diagram form, details of a prior known line driver amplifier.

FIG. 1 shows, in simplified block diagram form, details of a typical output stage of a prior known line driver amplifier 100. Amplifier 100 is a standard amplifier, including a class AB amplifier and a class B amplifier, of types well known in the art. The class AB amplifier includes transistors 104, 105, 114 and 115 and output transistors 106 and 116 all connected in well known fashion. The class B amplifier includes symmetrical stages one of which includes auxiliary amplifier 108 and output transistor 109 and the other includes auxiliary amplifier 118 and output transistor 119. Supply potential terminal 110 is connected to the source terminals of transistors 104 and 109 and to the drain terminal of transistor 106. A first input of amplifiers 108 and 118, the source terminals of transistors 106 and 116 and the drain terminals of transistors 109 and 119 are connected to output terminal 111 of amplifier 100. A bias potential is supplied via terminal 113 and transistor 104 to the class AB amplifier. The source terminals of transistors 115 and 119 and the drain terminal of transistor 116 are connected to ground potential terminal 120. Input signals are supplied to line driver amplifier 100 via input terminals 121 and buffer amplifier 122 to the gate of transistor 115.

Note that the class AB amplifier of FIG. 1 is ON for all input signals while the class B amplifier is OFF for "small" input signals. Specifically, the class B amplifier is in an OFF state until the input signal to line driver amplifier 100 exceeds a prescribed offset voltage. Line driver amplifier 100 has the ability to deliver a very "large" output current while maintaining well-controlled quiescent current. In order to improve the linearity of such line driver amplifiers it is desirable to have signal-independent open-loop gain of the line drive amplifier100. This is very difficult to achieve with the amplifier 100 of FIG. 1 because of significant variations in the amplifier output current levels. Additionally, it is important that the open-loop transfer function of the amplifier neither have so-called dead zones in it, or any abrupt transitions.

The direct current (dc) transfer function of the class B amplifier is given by:

$$\frac{V_{OUT}}{V_{IN}} = \frac{A_0 gm_{OUT} R_L}{1 + A_0 gm_{OUT} R_L}, \quad (1)$$

where $gm_{OUT}$ is the transconductance of the output transistor 109, 119, $A_0$ is the gain of the auxiliary amplifier 108, 118 and $R_L$ is the load impedance.

Figure 2:
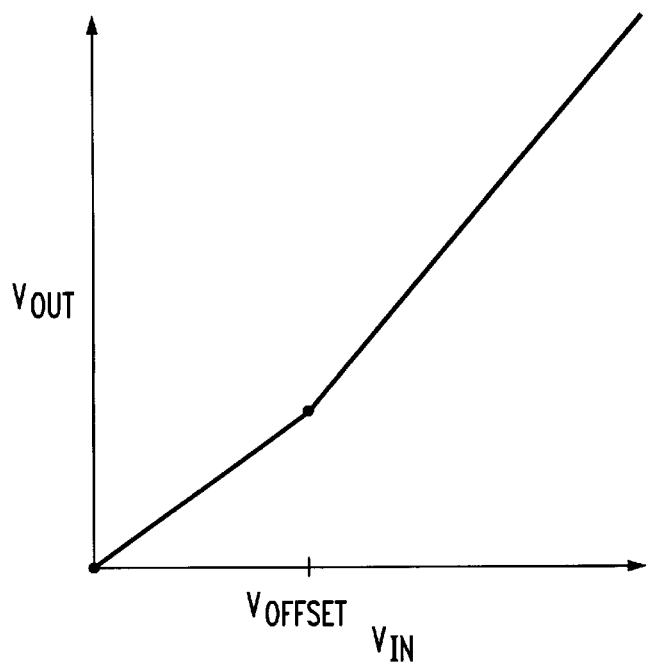
FIG. 2 graphically illustrates an open-loop gain transfer function for the amplifier of FIG. 1.

Output transistors 109, 119 are typically large devices because they need to be able to deliver a relatively large current to a small resistive load. As a result the dc transfer function value is very close to one (1), even at low output current levels. Moreover, the Class AB amplifier is usually biased at low current levels such as to save power consumption and its gain is less than one (1). Consequently, as shown in FIG. 2, there is an abrupt transition in the open-loop gain of line driver amplifier 100 when the class B amplifier becomes operational.

As indicated above, any such abrupt transition in the dc transfer function of amplifier 100 is extremely undesirable.

Figure 3:
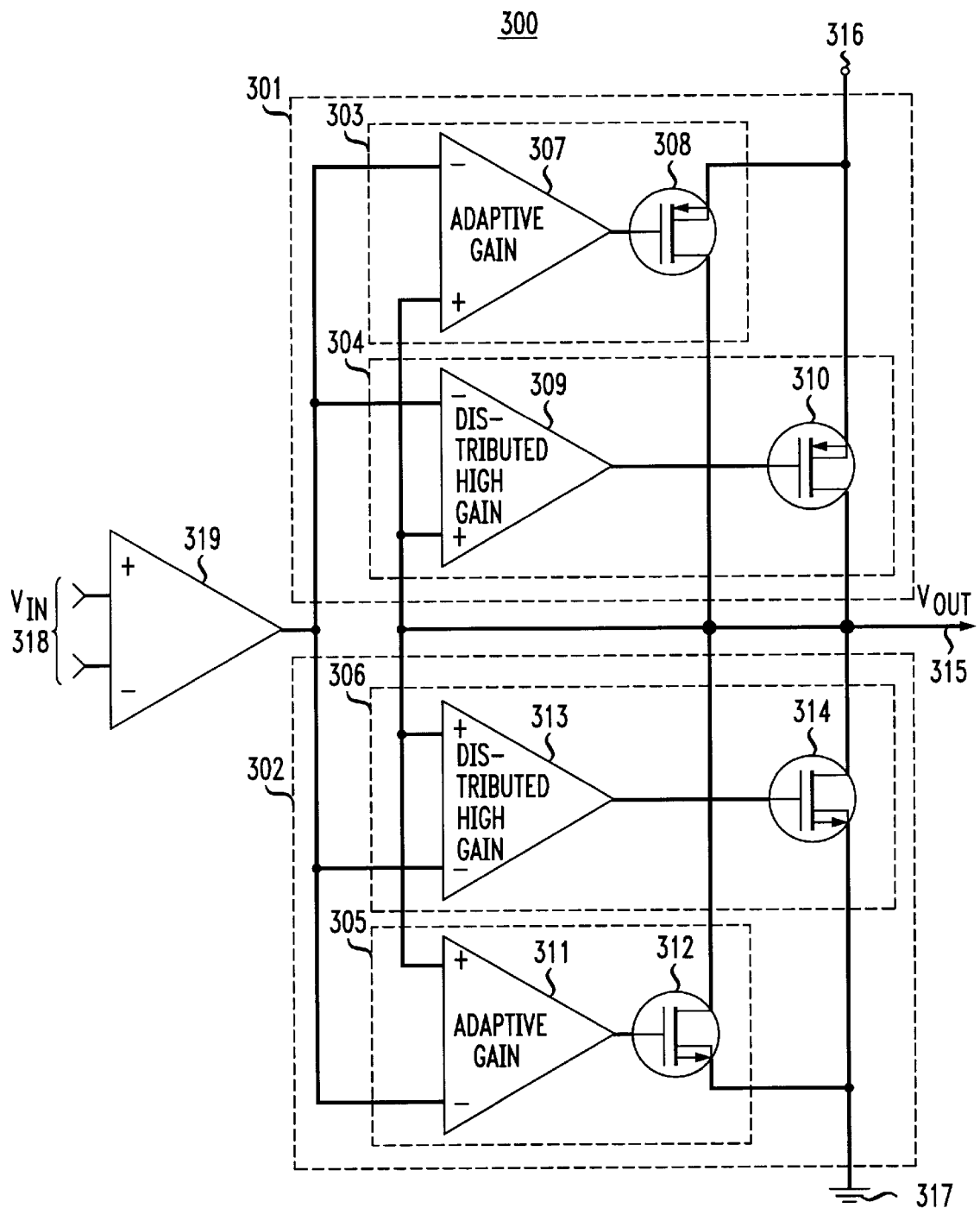
FIG. 3 shows, in simplified block diagram form, an amplifier including an embodiment of the invention.
Figure 4:
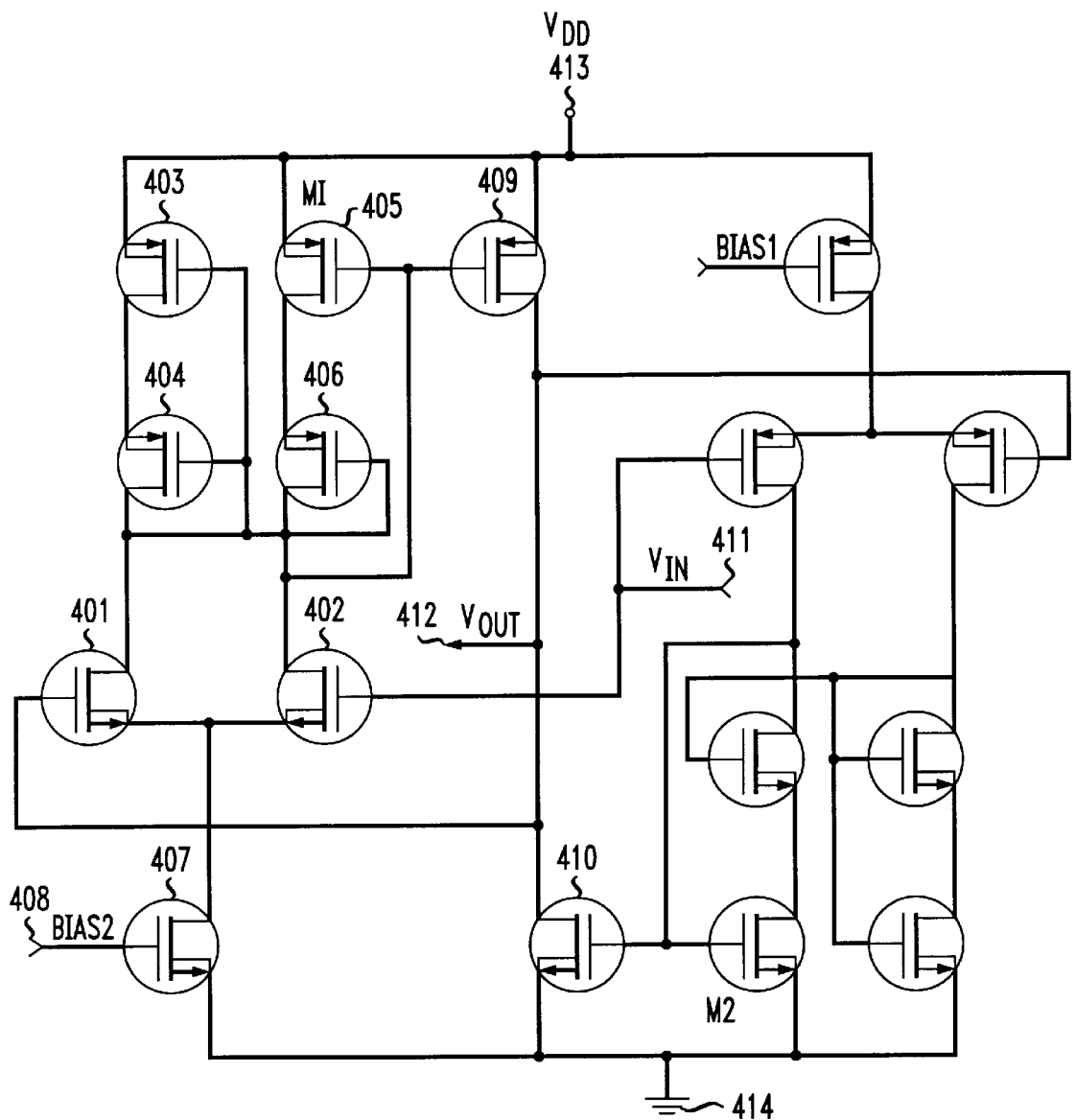
FIG. 4 shows details of a class AB amplifier having adaptive gain that may be employed in the embodiment of FIG. 3.

FIG. 3 shows, in simplified block diagram form, a line driver amplifier 300 including an embodiment of the invention. Specifically, shown is line driver amplifier 300 including amplifier section 301 and amplifier section 302. Amplifier section 301 includes adaptive gain amplifier stage 303 and distributed gain amplifier stage 304 connected in parallel. Amplifier stage 303 includes adaptive gain amplifier 307 and output transistor 308. In this example, adaptive gain amplifier 307 is a class AB amplifier, an example of which is shown in FIG. 4 and described below. Amplifier stage 304 includes distributed gain amplifier 309 and output transistor 310. In this example, distributed gain amplifier 309 is a Class B amplifier. Note that amplifier stage 304, in this example, includes a plurality of class B amplifiers connected in parallel and a similar plurality of smaller output transistors. Amplifier section 302 includes adaptive gain amplifier stage 305 and distributed gain amplifier stage 306 connected in parallel. Amplifier stage 305 includes adaptive gain amplifier 311 and output transistor 312. In this example, adaptive gain amplifier 311 is a class AB amplifier, an example of which is shown in FIG. 4 and described below.

Figure 5:
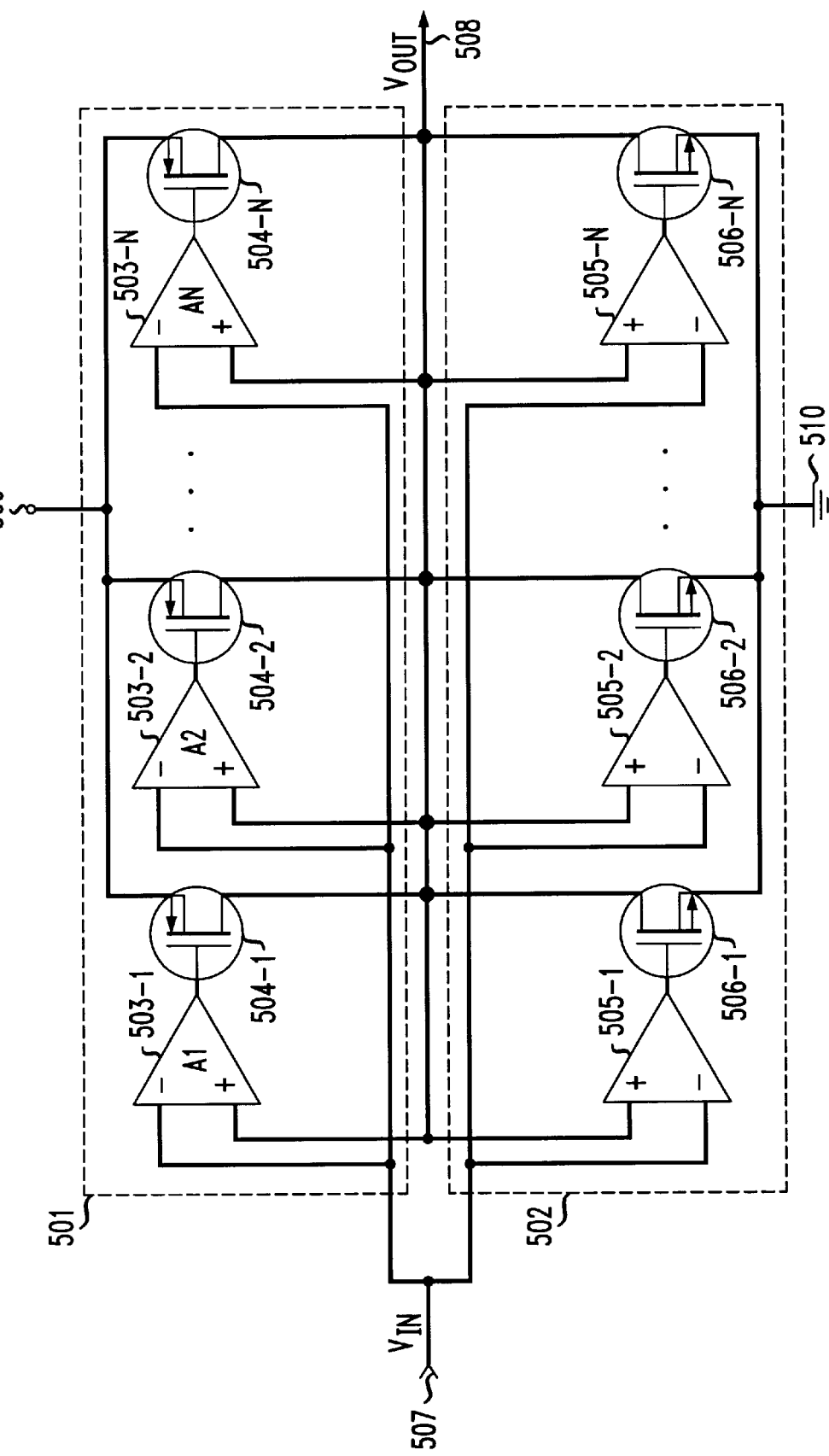
FIG. 5 shows, in simplified block diagram form, details of a class B distributed gain amplifier that may be employed in the embodiment of FIG. 3.

Amplifier stage 306 includes distributed gain amplifier 313 and output transistor4. In this example, distributed gain amplifier 313 is a Class B amplifier. Note that amplifier stage 306, in this example, includes a plurality of class B amplifiers connected in parallel and a similar plurality of smaller output transistors. An example of one such distributed amplifier is shown in FIG. 5 and described below. Output transistors 308 and 310, in this example, are "p" type field effect transistors having their source terminals connected to supply potential terminal 316 and their drain terminals connected to line driver amplifier 300 output terminal 315. Output transistors 312 and 314, in this example, are "n" type field effect transistors having their source terminals connected to terminal 317, which in this example is ground potential and their drain terminals connected to line driver amplifier 300 output terminal 315. One input of amplifiers 307, 309, 311 and 313 is also connected to output terminal 315 and this connection provides feedback. A second input of amplifiers 307, 309, 311 and 113 is to line driver amplifier 300 input terminal 318 via buffer amplifier 319 and its output terminal 320.

Indeed, by employing the adaptive and distributed amplifiers in line driver amplifier 300 results in a much smoother open-loop gain characteristic for the line driver amplifier and improved linearity.

FIG. 4 shows details of a class AB amplifier having adaptive gain that may be employed as adaptive gain amplifiers 307 and/or 311 in the embodiment of FIG. 3. Note that the class AB amplifier 307, 311 of FIG. 4 includes two (2) amplifier stages one of which is the inverse of the other, with the only essential difference being the type of field effect transistors (FETs) being used. As shown, where one of the amplifier stages employs "n" type FETs and "p" type FETs, the other stage employs "p" type FETs and "n" type FETs, respectively, and vice versa. Therefore, for simplicity and clarity of exposition only one of the amplifier stages will be described in detail.

The class AB amplifier of FIG. 4 provides a relatively low output current during steady state operation. Such a relatively low output current is sufficient to prevent significant distortion in the class AB amplifier output in the steady state, and at the same time advantageously incurs a reduced power consumption with respect to that of prior class AB amplifiers. In a transient state, depending on the amplifier inputs the amplifier gain may increase causing an input voltage to an output transistor in the output stage (described below) to increase. This results in an increase in the current flow through the output transistor that contributes to the amplifier output, thereby advantageously reducing distortion during the class AB transient state.

Returning to FIG. 4, shown is a differential amplifier including a differential pair of transistors 401 and 402, current mirror loads including transistors 403 and 404 and 405 and 406, bias transistor 407, bias input 408, output transistor 409, output transistor 410 for the other stage that provides an input to transistor 401, input terminal 411, output terminal 412, supply voltage terminal 413 and terminal 414, which in this example, is ground potential. During steady state operation, the differential amplifier operation is such that identical currents flow through the current mirror loads to transistors 401 and 402. Indeed, transistor 405 is operating in a saturated mode that causes it to appear like a diode. As is known, a diode has a relatively low impedance and, consequently, the differential amplifier has a relatively low gain, e.g., less than one (1). In the transient operating mode, for larger input signals to the differential amplifier, transistor 405 is driven from saturation into a so-called triode operating region causing the output impedance of the differential amplifier to increase and its gain approaches one (1) and equation 1, noted above holds. During the transient operating mode, operation of the current mirror loads and output transistor 409 for positive Vin are such that there is significantly more current flowing through output transistor 409, as will be apparent to those skilled in the art. It should be noted that in the transient operating mode some of the amplifier transistors are in saturation and some are in a triode operating mode. Once a transistor is operating in the triode mode its gm is small. Thus, when all of the amplifier transistors are operating in the triode mode the effective gm is then small. However, in the transistor operating range from saturation to triode operation the overall effective gm is larger overall. Again, this significantly, reduces distortion when the class AB amplifier is operating in the triode mode. Further details of operation of the class AB amplifier shown in FIG. 4 may be found in my co-pending U.S. patent application Ser. No. 09/119,431, filed on Jul. 20, 1998 and assigned to the assignee of this United States Patent application.

FIG. 5 shows, in simplified block diagram form, details of a class B distributed gain amplifier that may be employed in the embodiment of FIG. 3. Specifically, shown is distributed gain amplifier 500 including two amplifier stages 501 and 502. Amplifier stage 501 includes a plurality of auxiliary amplifiers 503-1 through 501-N and their associated output transistors 504-1 though 504-N, respectively. Similarly, amplifier stage 502 includes auxiliary amplifiers 505-1 through 505-N and their output transistors 506-1 through 506-N, respectively. Each of auxiliary amplifiers 503 and 505, in this example, includes a differential amplifier having first and second inputs and an output and has a "built-in", i.e., internally generated, offset voltage. The differential amplifiers are designed such as to provide a particular offset voltage, as will be described below regarding FIG. 8. A first input of each of auxiliary amplifiers 503 and 505 is connected to distributed gain amplifier 500 input terminal 507, while a second input of auxiliary amplifiers 503 and 505 is connected to amplifier 500 output terminal 508. Similarly, an output from each of auxiliary amplifiers 503-1 through 503-N is connected to a gate terminal of associated output transistors 504-1 through 504-N, respectively. A source terminal of each of output transistors 504 is connected to supply voltage terminal 509, while the drain terminal of each of output transistors 504 is connected to output terminal 508. Similarly, an output from each of auxiliary amplifiers 505-1 through 505-N is connected to a gate terminal of associated output transistors 506-1 through 506-N, respectively. A source terminal of each of output transistors 506 is connected to terminal 510, which in this example is ground potential, while the drain terminal of each of output transistors 506 is connected to output terminal 508. As shown, in this example, output transistors 504 are "p" type field effect transistors fabricated in CMOS technology. Similarly, in this example, output transistors 506 are "n" type field effect transistors also fabricated in CMOS technology.

Thus, it is seen that auxiliary amplifiers 503 and their associated output transistors 504 are distributed, as are auxiliary amplifiers 505 and their associated output transistors 506.

Figure 7:
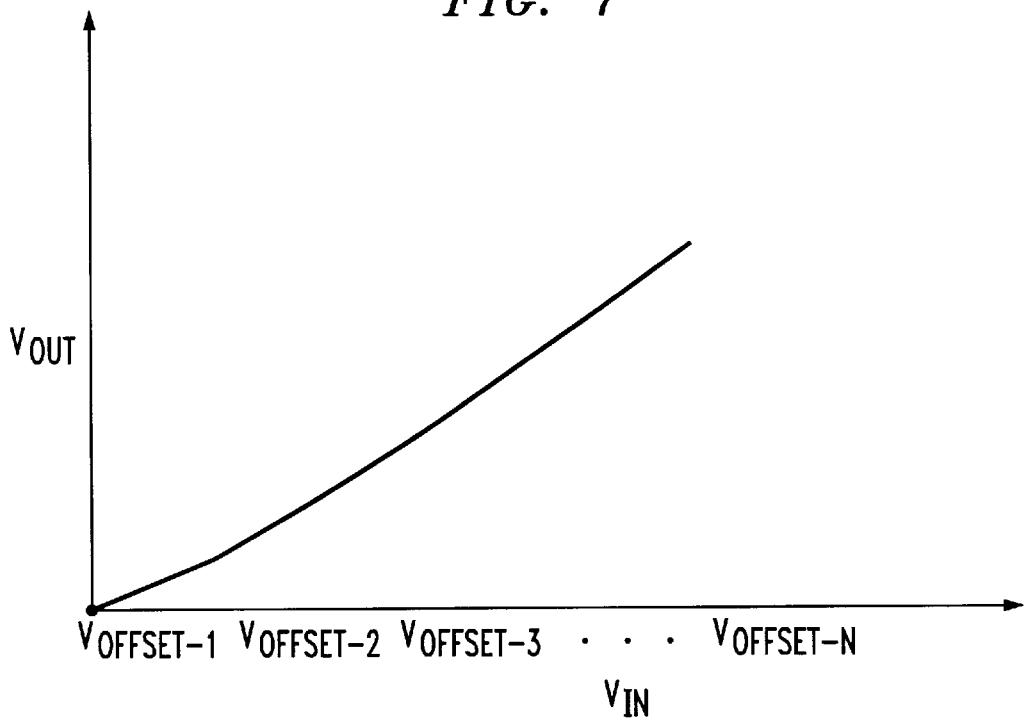
FIG. 7 graphically illustrates an open-loop gain transfer function of the line driver amplifier of FIG. 5 including an embodiment of the invention.

It is noted that auxiliary amplifiers 503-1 through 503-N and their associated output transistors 504-1 through 504-N, respectively, are connected in parallel between the distributed gain amplifier 500 input terminal 507, supply voltage terminal 509 and amplifier 500 output terminal 508. Again, auxiliary amplifiers 505-1 through 505-N and their associated output transistors 506-1 through 506-N, respectively, are connected in parallel between amplifier 500 input terminal 507, ground potential terminal 510 and amplifier 500 output terminal 508. Since, a plurality of output transistors 504 and 506 are employed in amplifier stages 501 and 502, respectively, the individual output transistors can be smaller in size than otherwise would be required if a single output transistor would have been used per amplifier stage as was done in prior line driver amplifiers. Indeed, because of their smaller size, each of output transistors 504 and 506 has a lower output current than an equivalent single output transistor. Moreover the smaller size of the output transistors 504 and 506 yields a smaller $gm_{OUT}$ overall which, in turn, yields a smoother transfer function, as shown in FIG. 7 below.

In this example, distributed gain amplifier 500 is implemented in integrated circuit form using CMOS technology. Additionally, in this example, auxiliary amplifiers 503 and 505 are arranged in sequence according to their individual built-in offset voltage. Thus, auxiliary amplifiers 503-1 and 505-1 each have the smallest desired offset voltage, while auxiliary amplifiers 503-N and 505-N have the largest desired offset voltage. The intermediate ones of auxiliary amplifiers 503 and 505 have offsets voltages that are determined by the circuit implementers, as desired. In this manner auxiliary amplifiers 503 and 505 maintain their associated output transistors 504 and 506, respectively, in an OFF state as long as the input signal magnitude supplied to terminal 507 is less than the auxiliary amplifier offset voltage. When the magnitude of the input signal supplied to input terminal 507 reaches or exceeds the offset voltage of the auxiliary amplifier (amplifiers) it drives its (they drive their) associated output transistor(s) into an ON state. Thus, one or more of output transistors 504 and one or more of output transistors 506 may be in an ON state. When the input signal magnitude is equal to or greater than the largest offset voltage, all of the output transistors are driven into the ON state and participate in delivering the distributed gain amplifier 500 output current.

It should be noted that this multi-auxiliary amplifier and multi-output transistor embodiment of the invention increases the linearity of overall line driver amplifier 500. Indeed, the overall line driver amplifier transfer function is much smoother. However, there is a tradeoff between the number of auxiliary amplifier and output transistor stages to be used and performance of distributed gain amplifier 500. Therefore, only a marginal improvement in performance can be expected, once a prescribed number of auxiliary amplifier stages has been employed, with the use of additional auxiliary amplifier and output transistor stages.

Figure 6:
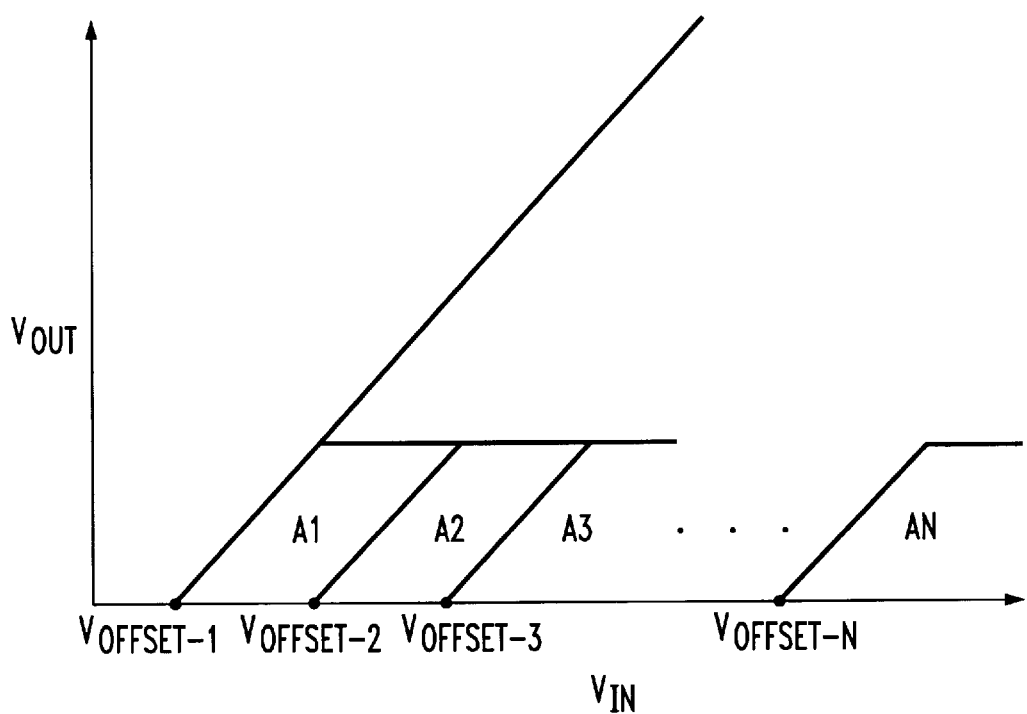
FIG. 6 graphically illustrates a transfer function for the class B amplifier shown in FIG. 5.

FIG. 6 graphically illustrates a transfer function for the class B amplifier shown in FIG. 5. Note that since there are built-in offsets in the amplifier stages of the class B amplifier of FIG. 5 some "jumps", i.e., abrupt changes, in the transfer function will always be present, that introduce non-linearity. However, since a significant number of stages are employed in the class B amplifier, the jumps smoothed out over a large voltage range, thereby reducing the non-linearity.

FIG. 7 graphically illustrates an open-loop gain transfer function of the line driver amplifier of FIG. 5 including an embodiment of the invention. As shown in FIG. 7, the overall transfer function for the line driver amplifier 300 of FIG. 3 is much smoother than that for the prior known line driver amplifier 100 of FIG. 1 as shown in FIG. 2.

Figure 8:
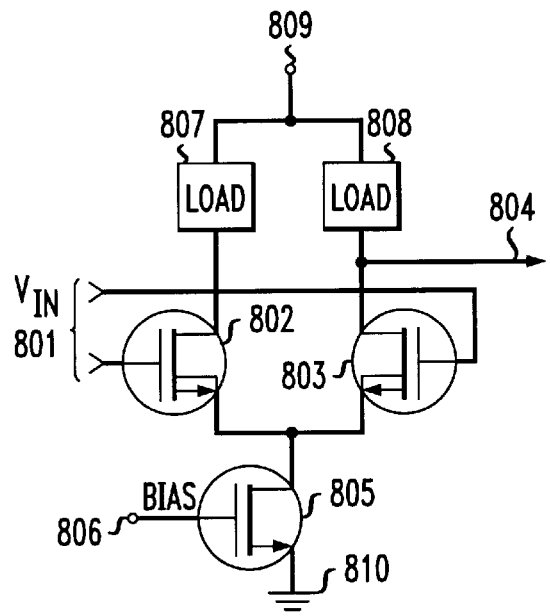
FIG. 8 shows, in simplified form, details of a differential amplifier including a built-in offset voltage level which may be employed in the auxiliary amplifiers used in the line driver amplifier of FIG. 5.

FIG. 8 shows, in simplified form, details of a differential amplifier including a built-in offset voltage level which may be employed in the auxiliary amplifiers 503 or 505 used in the line driver amplifier of FIG. 5. An input signal is supplied across input terminals 801 to gate terminals of field effect transistors 802 and 803. Transistors 802 and 803 are connected along with load impedances 807 and 808 and bias field effect transistor 805 in the well known differential pair amplifier configuration between supply voltage terminal 809 and, in this example, ground potential terminal 810. A bias voltage is applied via bias terminal 806 to the gate terminal of transistor 805 to set the operating current of the differential amplifier, in well known fashion.

As indicated above each of auxiliary amplifiers 503 and 505 has a built-in offset voltage level. This offset voltage level is obtained by causing transistors 802 and 803 to have a current mismatch. In order to control the offset voltage level, the current mismatch between transistors 802 and 803 should be larger than the threshold mismatch between the transistors. Thus, for the same gate-source terminal voltage across the transistor 802 and 803, the current mismatch will be proportional to the ratios W/L of the channels of transistors 802 and 803, where W is the channel width and L is the channel length. Indeed, the resulting current mismatch causes a desired deviation in the output voltage at output 804 relative to the voltage when transistors 802 and 803 are symmetrical. Thus, resulting in a desired offset voltage level, in accordance with the invention. Note that in practice, it is advantageous to have the channel at a fixed length L and only adjust the channel width W to obtain the desired current mismatch between transistors 802 and 803 and, hence the amplifier offset voltage.

Figure 9:
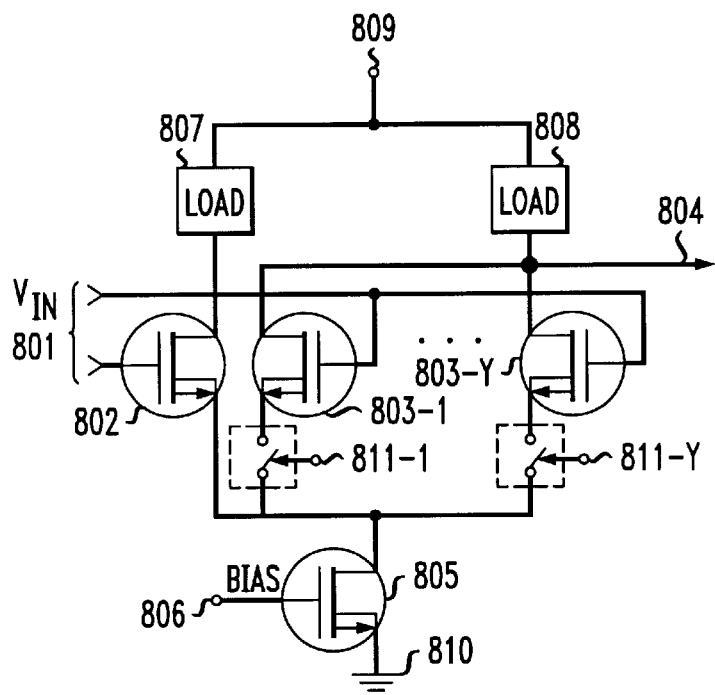
FIG. 9 shows, in simplified form, details of a differential amplifier having a programmable offset voltage level.

FIG. 9 shows, in simplified form, details of a differential amplifier having a programmable offset voltage level which may advantageously be employed in the auxiliary amplifiers used in the embodiment of the invention shown in FIG. 8. Elements that are similar in operation and functionality to those used in the differential amplifier shown in FIG. 8 and described above, have been similarly numbered and will not be discussed in detail here. Thus, shown are a plurality of field effect transistors 803-1 through 803-Y which have different channel areas relative to each other and to the channel area of transistor 802. Then, to obtain a desired offset voltage level a particular one or more of transistors 803-1 through 803-Y are controllable switched via controllable switches 811-1 through 811-Y, respectively, into the second leg of the differential amplifier 900 as transistor 803 of FIG. 8. The reasons that a desired offset voltage results have been described above relative to the differential amplifier shown in FIG. 8 and are equally applicable to differential amplifier 900 of FIG. 9.

The above-described arrangements are, of course, merely illustrative of the principles of the invention. Indeed, numerous other arrangements may be devised by those individuals skilled in the art without departing from the spirit and scope of the invention. For example, it may be desirable to employ output transistors of various sizes rather than all the same size depending upon the specific application or upon attaining a desired response characteristic. Moreover it is envisioned that the invention will be implemented in a so-called balanced amplifier configuration. How to realize such a balance amplifier configuration will be apparent to those possessing ordinary skill in the art.

What is claimed is:

1. A line driver amplifier comprising:
   at least one adaptive gain amplifier; and
   at least one distributed gain amplifier connected in parallel with said adaptive gain amplifier,
   said at least one distributed gain amplifier includes at least a first distributed gain amplifier stage including a first plurality of auxiliary amplifiers, each of said auxiliary amplifiers in said first plurality of auxiliary amplifiers having an input and an output and including a prescribed offset voltage level, and a first plurality of output transistors, each of said output transistors in said first plurality of output transistors being in a prescribed circuit relationship with the output of a respective one of said first plurality of auxiliary amplifiers forming a first plurality of auxiliary amplifier-output transistor pairs that are connected in parallel circuit relationship with each other, wherein each of said output transistors in said first plurality of output transistors is in an OFF state until an input signal supplied to the inputs of said first plurality of auxiliary amplifiers has a signal magnitude equal to or greater than the offset voltage level of the respective auxiliary amplifier in circuit relationship to said respective output transistor, whereby abrupt changes in a transfer function of said line driver amplifier are smoothed out.

2. The invention as defined in claim 1 wherein said at least one adaptive gain amplifier includes a first adaptive gain amplifier stage and a second adaptive gain amplifier stage connected in a symmetrical configuration.

3. The invention as defined in claim 2 wherein said at least one adaptive gain amplifier is a class AB amplifier.

4. The invention as defined in claim 1 wherein said at least one adaptive gain amplifier includes a differential amplifier having current mirror load impedances and an output transistor.

5. The invention as defined in claim 4 wherein said differential amplifier has first and second inputs and when signals supplied to said first and second inputs are balanced, currents flowing through said current mirror loads are balanced, and for large input signals said differential amplifier is in a transient mode of operation and said current mirror loads cause gain of said differential amplifier to increase thereby causing a significantly larger current to flow through said output transistor than when the inputs are symmetrical, whereby linearity of said line driver amplifier is improved and distortion is decreased.

6. The invention as defined in claim 5 wherein said output transistor is a field effect transistor and said line driver amplifier is implemented in CMOS technology.

7. The invention as defined in claim 3 wherein said at least one distributed gain amplifier includes said first distributed gain amplifier stage and a second distributed gain amplifier stage connected in a symmetrical configuration.

8. The amplifier as defined in claim 7 wherein said distributed gain amplifier is a class B amplifier.

9. The invention as defined in claim 1 wherein said at least one distributed gain amplifier includes said first distributed gain amplifier stage and a second distributed gain amplifier stage connected in a symmetrical configuration.

10. The amplifier as defined in claim 9 wherein said at least one distributed gain amplifier is a class B amplifier.

11. The invention as defined in claim 1 wherein said offset voltages of said first plurality of auxiliary amplifiers are set at values so that additional ones of said first plurality of output transistors are driven into an ON state with increased magnitude of said input signal.

12. The invention as defined in claim 11 wherein when said input signal has a magnitude less than a prescribed minimum value all of said first plurality of output transistors are in an OFF state and when said input signal has a magnitude greater than a prescribed maximum value all of said first plurality of output transistors are in an ON state.

13. The invention as defined in claim 12 wherein each of said first plurality of output transistors is smaller in size and carries less current when in an ON state than that of an equivalent single output transistor, if said equivalent single transistor were to be used in place of said first plurality of output transistors.

14. The invention as defined in claim 13 wherein said transistors are field effect transistors and said line driver amplifier is implemented in CMOS technology.

15. The invention as defined in claim 11 wherein each of said first plurality of auxiliary amplifiers has a prescribed internally generated offset voltage.

16. The invention as defined in claim 15 wherein said offset voltage of each of said first plurality of auxiliary amplifiers is controllably selectable.

17. The invention as defined in claim 15 wherein said offset voltage of each of said first plurality of auxiliary amplifiers has a voltage value different than said offset voltages for others of said first plurality of auxiliary amplifiers.

18. The invention as defined in claim 17 wherein each of said first plurality of auxiliary amplifiers includes at least one differential pair of first and second transistors and said offset voltage is generated by causing a current mismatch flowing through said first transistor relative to said second transistor.

19. The invention as defined in claim 18 wherein said current mismatch is obtained by the size of said first transistor being different from the size of said second transistor.

20. The invention as defined in claim 1 wherein said at least one distributed gain amplifier further includes a second distributed gain amplifier stage, said second distributed distributed gain amplifier stage being connected in circuit with said first distributed distributed gain amplifier stage wherein said at least one distributed gain amplifier is arranged as a symmetrical at least one distributed gain amplifier.

21. The invention as defined in claim 20 wherein said second distributed gain amplifier stage includes a second plurality of auxiliary amplifiers, each of said auxiliary amplifiers in said second plurality of auxiliary amplifiers having an input and an output and including a prescribed offset voltage level, and a second plurality of output transistors, each of said output transistors in said second plurality of output transistors being in a prescribed circuit relationship with the output of a respective one of said second plurality of auxiliary amplifiers forming a second plurality of auxiliary amplifier-output transistor pairs that are connected in parallel circuit relationship with each other, wherein each of said output transistors in said second plurality of output transistors is in an OFF state until an input signal supplied to the inputs of said second plurality of auxiliary amplifiers has a signal magnitude equal to or greater than the offset voltage level of the respective auxiliary amplifier in circuit relationship to said respective output transistor, whereby linearity in the frequency domain of said amplifier is improved.

22. The invention as defined in claim 21 wherein said offset voltages of said first and second plurality of auxiliary amplifiers are set at values so that additional ones of said first and second pluralities of output transistors are driven into an ON state with increased magnitude of said input signal.

23. The invention as defined in claim 22 wherein when said input signal has a magnitude less than a prescribed minimum value all of said first and second pluralities of output transistors are in an OFF state and when said input signal has a magnitude greater than a prescribed maximum value all of said first and second plurality of output transistors are in an ON state.

24. The invention as defined in claim 23 wherein each of said first and second pluralities of output transistors is smaller in size and carries less current when in an ON state than that of an equivalent single output transistor, if a first equivalent single transistor were to be used in place of said first plurality of output transistors and if a second equivalent single transistor were to be used in place of said second plurality of output transistors.

25. The invention as defined in claim 24 wherein said transistors are field effect transistors and said line driver amplifier is implemented in CMOS technology.

26. The invention as defined in claim 21 wherein each auxiliary amplifier of said first and second pluralities of auxiliary amplifiers has a prescribed internally generated offset voltage.

27. The invention as defined in claim 26 wherein said offset voltage of each of said first plurality of auxiliary amplifiers is controllably selectable.

28. The invention as defined in claim 26 wherein said offset voltage of each of said auxiliary amplifiers of said first and second pluralities of auxiliary amplifiers has a voltage value different than said offset voltages for others of said first plurality of auxiliary amplifiers and said second plurality of auxiliary amplifiers, respectively.

29. The invention as defined in claim 26 wherein each auxiliary amplifier of said first plurality and second pluralities of auxiliary amplifiers includes at least one differential pair of first and second transistors and said offset voltage is generated by causing a current mismatch flowing through said first transistor relative to said second transistor.

30. The invention as defined in claim 29 wherein said current mismatch is obtained by the size of said first transistor being different from the size of said second transistor.

31. A line driver amplifier comprising:

an adaptive gain amplifier including a first adaptive gain amplifier stage having a first adaptive gain stage and a first associated output transistor and a second adaptive gain amplifier stage having a second adaptive gain stage and a second associated output transistor; and a distributed gain amplifier including a first distributed gain amplifier stage having a first distributed gain stage and a first associated distributed output transistor and a second distributed gain amplifier stage having a second distributed gain stage and a second associated distributed output transistor, said first adaptive gain amplifier stage being connected in parallel with said first distributed gain amplifier stage, and said second adaptive gain amplifier stage being connected in parallel with said second distributed gain amplifier stage, each of said first and second distributed amplifier stages including a first and a second plurality of auxiliary amplifiers, respectively, each of said auxiliary amplifiers having an input and an output and including a prescribed offset voltage level, and each of said first and second distributed output transistors being in a prescribed circuit relationship with the output of a respective one of said first and second plurality of auxiliary amplifiers forming first and second pluralities of auxiliary amplifier-output transistor pairs that are connected in parallel circuit relationship with each other, wherein each of said distributed output transistors is in an OFF state until an input signal supplied to the inputs of said auxiliary amplifiers has a signal magnitude equal to or greater than the offset voltage level of the respective auxiliary amplifier in circuit relationship to said respective one of said distributed output transistors, whereby linearity of said line driver amplifier is improved and distortion is decreased.

32. The invention as defined in claim 31 wherein said first and second adaptive gain amplifier stages and said first and second distributed gain amplifier stages are connected such that said line driver amplifier is in a symmetrical amplifier configuration.

33. The invention as defined in claim 31 wherein adaptive gain amplifier is a class AB amplifier.

34. The invention as defined in claim 31 wherein each of said first and second adaptive gain stages includes a differential amplifier having current mirror load impedances and an output transistor.

35. The invention as defined in claim 34 wherein said differential amplifier has first and second inputs and when signals to said first and second inputs are balanced currents flowing through said current mirror loads are balanced and for large input signals said differential amplifier is in a transient mode of operation and said current mirror loads cause gain of said differential amplifier to increase thereby causing a significantly larger current to flow through said output transistor than when the inputs are balanced, whereby linearity of said line driver amplifier is improved and distortion is decreased.

36. The amplifier as defined in claim 35 wherein each of said first and second dustributed gain stages includes a class B amplifier.

37. The invention as defined in claim 31 wherein said offset voltages of said first and second plurality of auxiliary amplifiers are set at values so that additional ones of said first and second distributed output transistors are driven into an ON state with increased magnitude of said input signal.

38. The invention as defined in claim 37 wherein when said input signal has a magnitude less than a prescribed minimum value all of said first and second distributed output transistors are in an OFF state and when said input signal has a magnitude greater than a prescribed maximum value all of said first and second distributed output transistors are in an ON state.

39. The invention as defined in claim 38 wherein each of said first and second distributed output transistors is smaller in size and carries less current when in an ON state than that of an equivalent single output transistor, if a first equivalent single transistor were to be used in place of said first distributed output transistors and if a second equivalent single transistor were to be used in place of said second distributed output transistors.

40. The invention as defined in claim 31 wherein each auxiliary amplifier of said first and second pluralities of auxiliary amplifiers has a prescribed internally generated offset voltage.

41. The invention as defined in claim 40 wherein said offset voltage of each of said first plurality of auxiliary amplifiers is controllably selectable.

42. The invention as defined in claim 40 wherein said offset voltage of each of said auxiliary amplifiers of said first and second pluralities of auxiliary amplifiers has a voltage value different than said offset voltages for others of said first plurality of auxiliary amplifiers and said second plurality of auxiliary amplifiers, respectively.

43. The invention as defined in claim 41 wherein each auxiliary amplifier of said first plurality and second pluralities of auxiliary amplifiers includes at least one differential pair of first and second transistors and said offset voltage is generated by causing a current mismatch flowing through said first transistor relative to said second transistor.

44. The invention as defined in claim 43 wherein said current mismatch is obtained by the size of said first transistor being different from the size of said second transistor.

* * * * *